United States Patent [19]
Yim et al.

[11] Patent Number: 5,475,647
[45] Date of Patent: Dec. 12, 1995

[54] FLASH WRITE CIRCUIT FOR A SEMICONDUCTOR MEMORY DEVICE

[75] Inventors: Sung-Min Yim; Jang-Kyu Lee; Min-Tea Kim, all of Kyungki-do; Seong-Ook Jung, Seoul, all of Rep. of Korea

[73] Assignee: Samsung Electronics Co., Ltd., Suwon, Rep. of Korea

[21] Appl. No.: 298,290

[22] Filed: Aug. 31, 1994

[30] Foreign Application Priority Data

Sep. 3, 1993 [KR] Rep. of Korea .................. 17619/1993

[51] Int. Cl.$^6$ ...................................... G11C 8/00
[52] U.S. Cl. .............................. 365/230.03; 365/189.01; 365/218
[58] Field of Search ..................... 365/189.01, 230.03, 365/230.06, 218, 189.05

[56] References Cited

U.S. PATENT DOCUMENTS

| | | | |
|---|---|---|---|
| 5,003,510 | 3/1991 | Kamisaki | 365/189.01 |
| 5,134,589 | 7/1992 | Hamano | 365/218 X |
| 5,282,177 | 1/1994 | McLaury | 365/230.03 X |
| 5,305,278 | 4/1994 | Inoue | 365/230.03 |

*Primary Examiner*—Joseph A. Popek
*Attorney, Agent, or Firm*—Robert A. Westerlund; Stephen R. Whitt; Charles R. Donohoe

[57] ABSTRACT

A semiconductor memory device having a plurality of memory blocks and a plurality of I/O control circuits operatively associated with respective ones of the memory blocks. Each of the I/O control circuits includes a flash write enable signal generator responsive to a flash write mode indication signal and a respective memory block address signal, for generating a memory block specific flash write enable signal. Each of the I/O control circuits further includes a plurality of first column selectors connected between respective first alternate pairs of bit lines and respective first data input/output lines, a plurality of second column selectors connected between respective second alternate pairs of bit lines and respective second data input/output lines, and a plurality of flash write control logic circuits responsive to the memory block specific flash write enable signal and a respective one of a plurality of column select signals for generating a corresponding plurality of column selector drive signals. The first column selectors are responsive to respective ones of the column selector drive signals for selectively coupling data to/from respective ones of the first alternate pairs of the bit lines from/to the first data input/output lines. The second column selectors are responsive to respective ones of the column selector drive signals for selectively coupling data to/from respective ones of the second alternate pairs of the bit lines from/to the second data input/output lines.

20 Claims, 4 Drawing Sheets

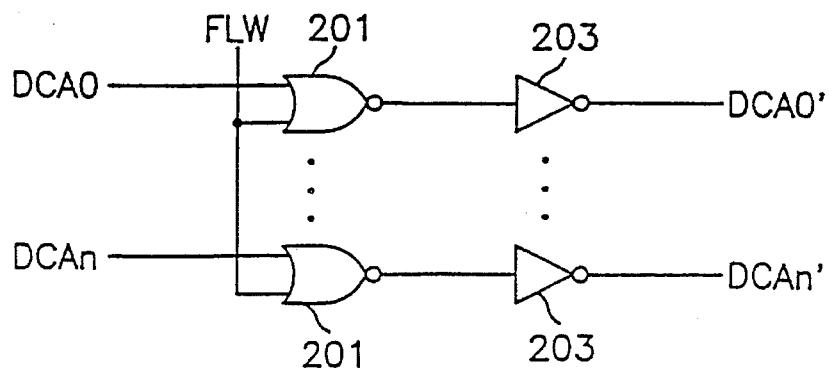
FIG. 2
(PRIOR ART)
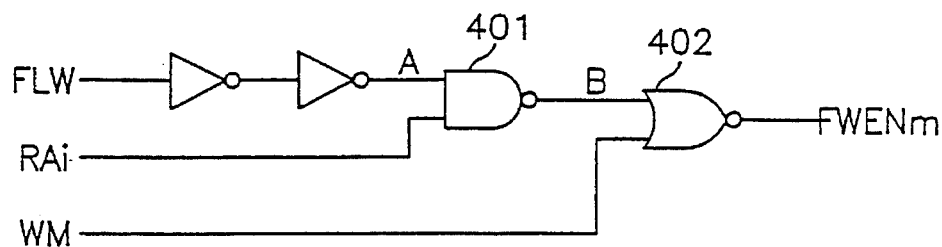
FIG. 4
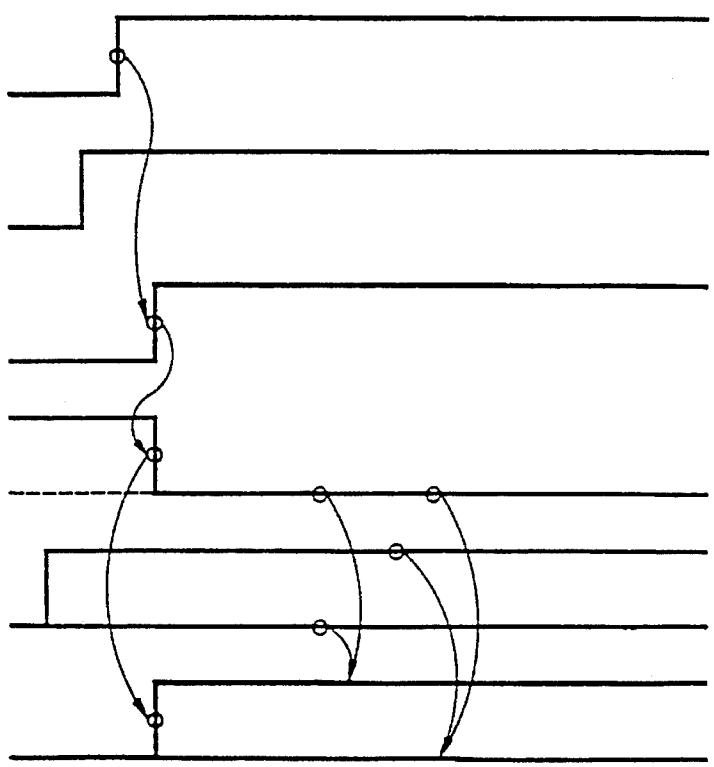
FIG. 5(a) FLW
FIG. 5(b) RAi
FIG. 5(c) A
FIG. 5(d) B
FIG. 5(e) WM
FIG. 5(f) FWENm

FLASH WRITE CIRCUIT FOR A SEMICONDUCTOR MEMORY DEVICE

BACKGROUND OF THE INVENTION

The present invention relates generally to semiconductor memory devices, and, more particularly, to a semiconductor memory device having an improved flash write mode.

Various types of semiconductor memory devices, e.g., video RAMs, employ a flash write mode for concurrent processing of large amounts of data. The flash write mode resets data stored in a large number of memory cells to a "high" logic level (hereinafter referred to simply as either "high" or "high level") or a "low" logic level (hereinafter referred to simply as either "low" or "low level"). In the flash write mode, it is possible to reset all of the memory cells which are connected to a selected word line, during a single/RAS cycle.

With reference now to FIG. 1, there can be seen a schematic block diagram of a semiconductor memory device which includes a conventional flash write circuit. As can be seen in FIG. 1, the memory device is divided into four memory blocks 100. Column address signals for designating bit lines of the memory device are applied to a column address buffer 101, and the buffered column address signals output by the column address buffer 101 are applied to a column decoder 102. The column decoder 102 decodes the buffered column address signals to generate column designation signals DCAi (where, i=0-n) and then ORs the column designation signals with a flash write control signal FLW to generate column selection (or, column select) signals DCAi' (where, i'=0-n). The number of column designation and column selection signals is equal to the number of bit lines. The respective column selection signals DCAi' are transmitted to corresponding column selection signal lines CSLi (where, i=0-n), and are applied to the control gate of respective column selection gates 104 connected between a common data input/output line and respective ones of the bit lines in the memory blocks 100. The column selection signals CSLi are shared in common by the memory blocks 100 and thus, the column decoder 102 controls the column selection gates of all of the memory blocks 100.

With reference now to FIG. 2, there can be seen a detailed circuit diagram of the column decoder 102 for Oring the decoded column designation signals DCAi with the flash write control signal FLW. The column designation signals DCAi are respectively applied to first input terminals of n+1 NOR gates 201 and tile flash write control signal FLW is commonly applied to second input terminals of the respective NOR gates 201. The respective output signals of the NOR gates 201 are inputted to corresponding n+1 inverters 203. The output of the inverters 203 are the column selection signals DCAi'. Therefore, if the flash write control signal FLW is high, all of the column selection signals DCAi' are also high.

With reference now to both FIGS. 1 and 2, when the flash write control signal FLW is low, i.e., when the flash write mode is not enabled, the logic level of the column selection signals DCAi' are determined by the logic level of the corresponding column designation signals. In operation, a single column selection signal corresponding to the decoded column address signals which identify the selected column, is driven high. To the contrary, when the flash write control signal FLW is high, i.e., when the flash write mode is enabled, all of the column selection signals DCAi are driven high, so that all of the column selection lines CSLi are driven high, and thus, all of the corresponding column selection gates 104 are turned on. As a result, if data of a high logic level or a low logic level is applied to the common data input/output line, that data is written into all of the memory cells of a selected word line of a selected memory block 100.

As will be appreciated by those skilled in the art, since all of the column selection lines are simultaneously turned, the conventional flash write circuit generates high peak current and suffers from noise problems associated therewith. Thus, current consumption is unduly high and the reliability of the memory device is impaired.

Based on the above and foregoing, it can be appreciated that there presently exists a need in the art for a flash write circuit for a semiconductor memory device which overcomes the above-mentioned shortcomings and drawbacks of the conventional flash write circuit. The present invention fulfills this need.

SUMMARY OF THE INVENTION

The present invention, in a first embodiment, encompasses a semiconductor memory device having a plurality of memory blocks and a plurality of I/O control circuits operatively associated with respective ones of the memory blocks. Each of the I/O control circuits includes a flash write enable signal generator responsive to a flash write mode indication signal and a respective memory block address signal, for generating a memory block specific flash write enable signal. Each of the I/O control circuits further includes a plurality of first column selectors connected between respective first alternate pairs of bit lines and respective first data input/output lines, a plurality of second column selectors connected between respective second alternate pairs of bit lines and respective second data input/output lines, and a plurality of flash write control logic circuits responsive to the memory block specific flash write enable signal and a respective one of a plurality of column select signals for generating a corresponding plurality of column selector drive signals. The first column selectors are responsive to respective ones of the column selector drive signals for selectively coupling data to/from respective ones of the first alternate pairs of the bit lines from/to the first data input/output lines. The second column selectors are responsive to respective ones of the column selector drive signals for selectively coupling data to/from respective ones of the second alternate pairs of the bit lines from/to the second data input/output lines.

In a second embodiment, each of the I/O control circuits includes a flash write signal generator like that of the first embodiment, a pair of first data input/output lines, a pair of second data input/output lines, a plurality of first column selectors connected between respective first alternate pairs of the bit lines and the first data input/output lines, the first column selectors being responsive to respective ones of the column select signals for selectively coupling data to/from respective ones of the first alternate pairs of the bit lines from/to the first data input/output lines, a plurality of second column selectors connected between respective second alternate pairs of the bit lines and the second data input/output lines, the second column selectors being responsive to respective ones of the column select signals for selectively coupling data to/from respective ones of the second alternate pairs of the bit lines from/to the second data input/output lines, a plurality of third column selectors connected between respective first alternate pairs of the bit lines and the first data input/output lines in parallel with the first column selectors, the third column selectors being responsive to a respective one of the memory block specific flash write enable signals for selectively coupling data to/from respective ones of the first alternate pairs of the bit lines from/to the first data input/output lines, and, a plurality of fourth column selectors connected between respective second alternate pairs of the bit lines and the second data input/output lines in parallel with the second column selectors, the fourth column selectors being responsive to the respective one of the memory block specific flash write enable signals for selectively coupling data to/from respective ones of the second alternate pairs of the bit lines from/to the second data input/output lines.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 2 depicts the input/output control signal generator of the flash write circuit depicted in FIG. 1;

FIG. 4 depicts a preferred embodiment of the flash write enable signal generator of the flash write circuit depicted in FIG. 3;

FIG. 5 is an operational timing diagram for a flash write operation of the flash write circuit depicted in FIG. 3; and, FIG. 6 is a schematic block diagram depicting a semiconductor memory device having a flash write circuit constructed in accordance with a second preferred embodiment of the present invention.

DETAILED DESCRIPTION OF THE INVENTION

In the following description, the number of memory blocks and data input/output lines are specifically set forth for ease of illustration and description of the present invention. However, it should be clearly understood that the present invention is not limited to these or other such details of implementation disclosed herein.

FIRST PREFERRED EMBODIMENT

Figure 1:
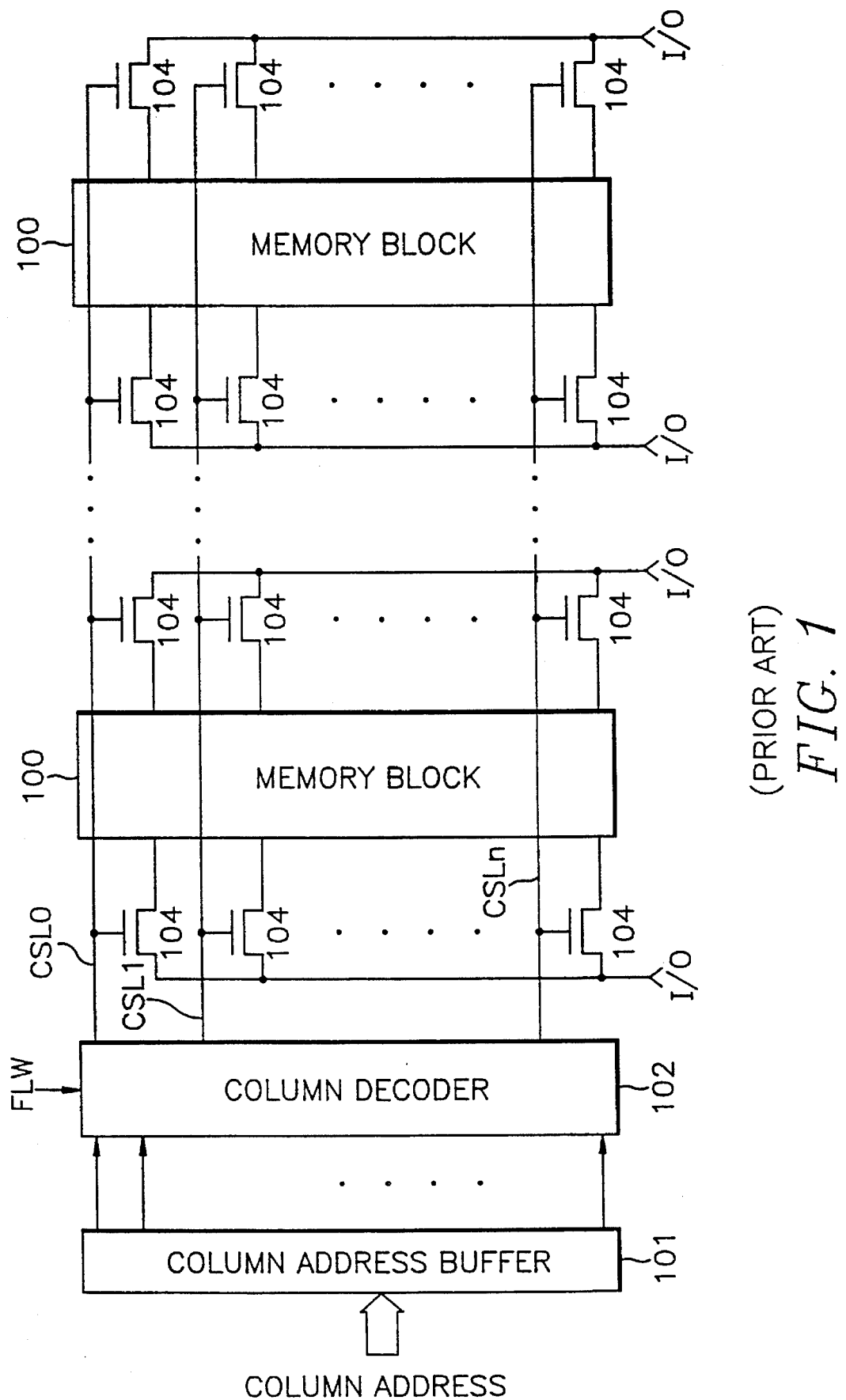
FIG. 1 is a schematic block diagram depicting a conventional flash write circuit.
Figure 3:
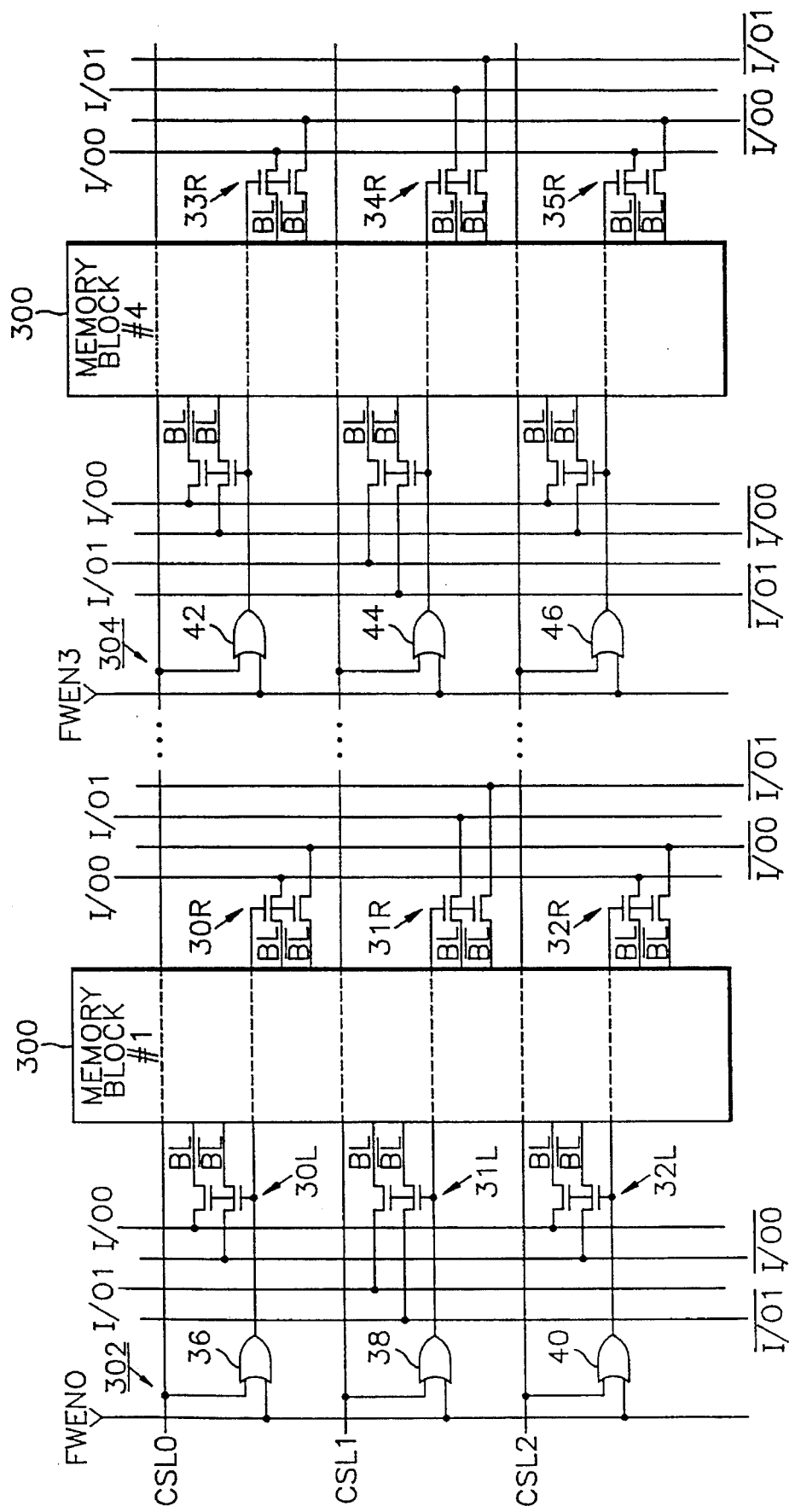
FIG. 3 is a schematic block diagram depicting a semiconductor memory device having a flash write circuit constructed in accordance with a first preferred embodiment of the present invention.

With reference now to FIG. 3, there can be seen a semiconductor memory device divided into four memory blocks 300. Although not shown, it is well-known in the art that each of the memory blocks 300 includes a matrix of intersecting bit lines and word lines, and a multiplicity or array of memory cells coupled to respective ones of the bit lines and word lines adjacent the intersections thereof. The memory cells may conveniently be single transistor/single capacitor dynamic memory cells, but this, of course, is not limiting to the present invention.

Column address signals (not shown) which identify respective ones of the bit lines are applied to a column address buffer (not shown), and the buffered column address signals output by the column address buffer are applied to a column decoder (not shown). The column decoder functions in the normal manner to decode the buffered column address signals, and to generate decoded column selection signals DCAi (where, i=1-n) The column selection signals DCAi are transmitted to corresponding column selection signal lines CSLi (where, i=1-n). The respective memory blocks 300 each include a flash write enable signal generator (see FIG. 4) for generating memory block specific flash write enable signals FWENm (where, m=0-3, and OR gates 302-304 for OR-ing the respective memory block specific flash write enable signals with the column selection signals. The output of the OR gates are applied to control terminals of respective column selection gates 30L-35R.

With additional reference now to FIG. 4, each of the flash write enable signal generators includes a NAND gate 401 for receiving, at a first input terminal thereof, a flash write control signal FLW externally supplied via two serially-connected inverters, and for receiving, at a second input terminal thereof, a memory block selection signal Rai, and a NOR gate 402 for receiving an output signal of the NAND gate 401 at a first input terminal thereof and write mask signal WM at a second input terminal thereof, to thereby generate the memory block specific flash write enable signal FWENm. When the write mask signal WM is high, the write operation is disabled. The logic state of the flash write enable signals FWENm is determined by the logic levels of the input signals to the flash write enable signal generators as shown in the following Table 1, where "H" represents the high logic level, and "L" represents the low logic level.

TABLE 1

| FLW | RAi | WM | FWENm |
| --- | --- | --- | --- |
| L | L | L | L |
| L | L | H | L |
| L | H | L | L |
| L | H | H | L |
| H | L | L | L |
| H | L | H | L |
| H | H | L | H |
| H | H | H | L |

As shown in Table 1 and FIG. 5, when the flash write control signal FLW and the memory block selection signal Rai are both high, if the write mask signal WM is low, the flash write enable signal FWENm is driven high, and, on the contrary, if the write mask signal WM is high, the flash write enable signal FWENm is driven low. When the flash write enable signal FWENm is high, a fish write operation is enabled, and when the flash write enable signal FWENm is low, a write mask operation is enabled. If the memory device does not have a write mask function, the flash write enable signal FWENm can be generated by simply AND-ing the flash write control signal FLW and the respective memory block selection signal Rai.

A first data input/output line pair I/O0 and /I/O0, and a second data input/output line pair I/O1 and /I/O1 are arranged adjacent to each other on both the left and right sides of each memory block 300. The data input/output lines in each pair are complementary. The bit line pairs BL and /BL of the memory blocks 300 are connected to the first and second data input/output line pairs on both the left and right sides of the respective memory blocks 300 in an alternating fashion, via respective column selection gates 30L-35R. The bit line pairs connected to the column selection gates 30L-35R transfer read data sensed and amplified by corresponding sense amplifiers (not shown) to the data I/O lines, and transfer write data from the data I/O lines into the memory cells (not shown) via the sense amplifiers. The column selection signals CSL0, CSL2, . . . , associated with the even-numbered column selection gates (e.g., 30L,R,32L, R, etc.) connected to the first data input/output line pair I/O0 and /I/O0 are arranged in parallel to the column selection lines CSL1, CSL3, . . . associated with the odd-numbered column selection gates (e.g., 31L,R, etc.) connected to the second data input/output line pairs I/O1 and/I/O1.

The flash write enable signals FWENo-FWEN3 are respectively provided to the first-fourth memory blocks 300. The column selection gates 30L-35R are responsive to column selector drive signals generated by OR-ing the column selection signals transmitted over the respective column selection signal lines CSLi with the respective flash write enable signals FWENm. The output signals of the OR gates 36-46 are applied to control terminals of the corresponding column selection gates.

With additional reference now to FIG. 3, when the flash write enable signals FWENm are all low, the outputs of the OR gates are determined according to the logic level of the column selection signal lines, thereby enabling a normal memory access operation to be performed. For example, for a read operation, a word line (not shown) of a selected memory block 300 identified by a decoded row address signal (not shown) is activated, and the first and second data input/output line pairs are alternately enabled, thereby pipelining the data read from the memory cells (not shown) coupled to the activated word line, from the bit line pairs to the data I/O line pairs. That is, 1-bit data is successively transmitted to the first and second data input/output line pairs arranged on both the left and right-hand side of the memory blocks 300. On the contrary, when a flash write enable signal, for example, FWEN3, is high, only the column selection gates 304 of the selected memory block 300 (in this case, the fourth memory block 300) are turned on, so that an input data bit is coupled to the bit line pairs via the corresponding data input/output line pairs. Then, the flash write operation is performed to store data into the memory cells connected to a selected word line in the selected memory block 300. Since the memory block selection signals Rai corresponding to the non-selected memory blocks 300 is low, the FWENm signals corresponding thereto are also low, thereby preventing a flash write operation from being performed in the non-selected memory blocks.

SECOND PREFERRED EMBODIMENT

Figure 6:
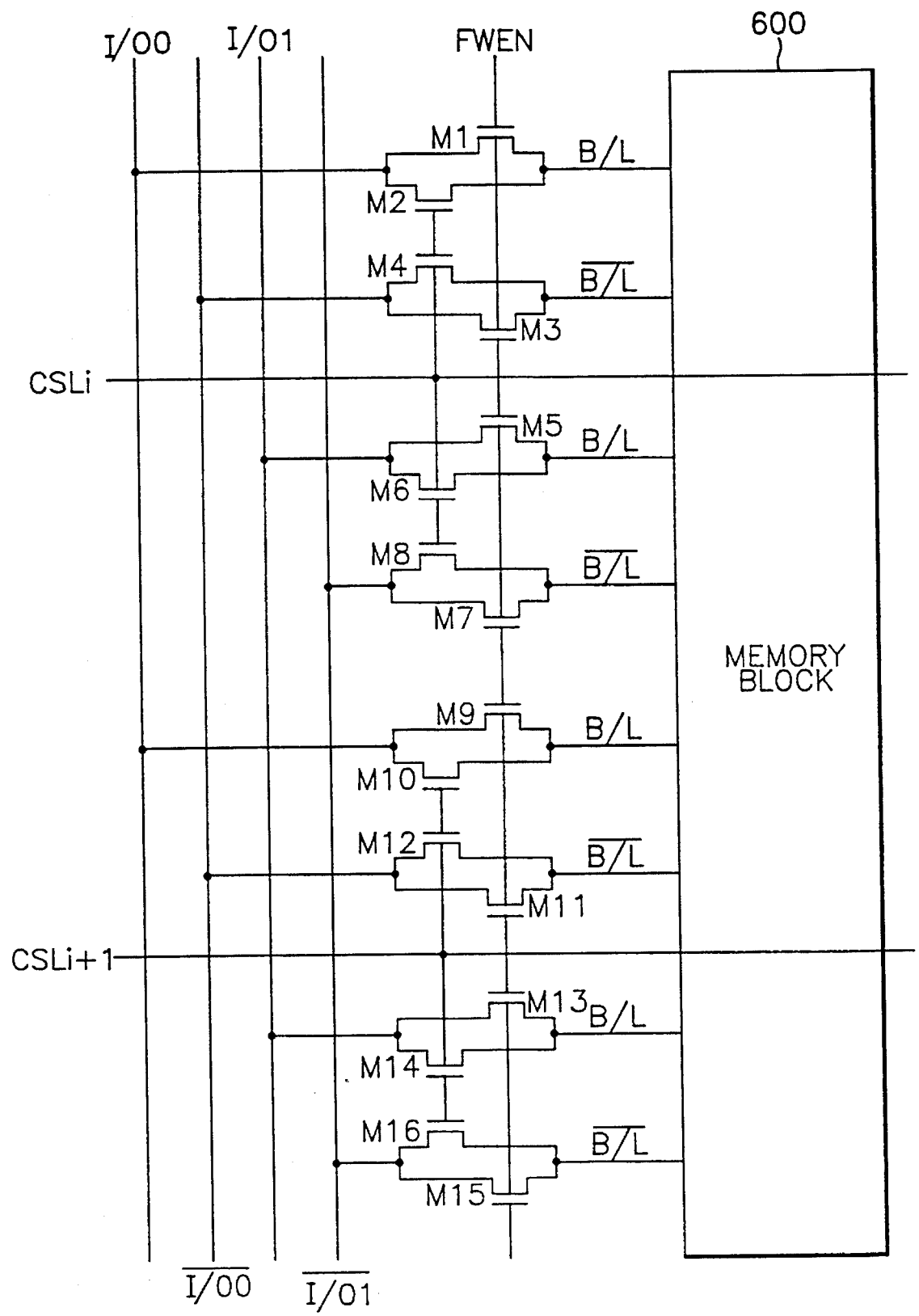

With reference now to FIG. 6, a memory block 600 represents any of a plurality of memory blocks of a semiconductor memory device in which a flash write circuit constructed in accordance with the second preferred embodiment of the present invention is employed. A flash write enable signal FWEN, preferably, a memory block specific flash write enable signal produced by a flash write enable signal generator like that described previously in connection with the first preferred embodiment, is applied to each of the memory blocks 600.

As can be seen in FIG. 6, a first data input/output pair I/O0 and /I/O0, and a second data input/output pair I/O1 and/I/O1 are arranged on one side of the memory block 600. Further, respective bit line pairs are connected to respective ones of the data input/output line pairs via channels of respective pairs of parallel-connected column selection gates (M1, M2; M3, M4; . . . , M15, M16). The flash write enable signal FWEN corresponding to the depicted memory block 600 is commonly applied to control terminals of the first column selection gates M1, M3, . . . , M15, and corresponding column selection signals CSLi and CSL+1 are applied to control terminals of the second column selection gates M2, M4, . . . , M16. Thus, if the flash write enable signal FWEN is high, all of the first column selection gates are turned on, whereby all of the bit line pairs of the memory block 600 are coupled to respective ones of the data input/output line pairs. Consequently, data applied to the data input/output line pairs is transmitted to all of the bit line pairs, thereby enabling a flash write operation to be performed in the same manner as was described previously in connection with the first preferred embodiment of the present invention. On the other hand, when the flash write enable signal FWEN is low, a normal data access operation is enabled to be performed according to the column selection signals CSLi and CSLi+1 provided to the control terminals of the second column selection gates.

In short, the first column selection gates controlled by the flash write enable signal are connected in parallel to the second column selection gates controlled by the column selection signals, between the bit line pairs and the data input/output line pairs, to thereby enable execution of a flash write operation or a normal data access operation. Therefore, only the column selection gates corresponding to the selected memory block are turned on during the flash write operation, and the remainder of the column selection gates are turned off, thereby reducing the peak current and unnecessary current consumption during the flash write operation.

Based on the above and foregoing, it can be appreciated that both embodiments of the present invention overcome the drawbacks and shortcomings of the conventional flash write circuits described hereinabove.

Although two separate preferred embodiments of the present invention have been described in detail hereinabove, it should be clearly understood that many variations and/or modifications which may appear to those skilled in the art will still fall within the spirit and scope of the present invention as defined in the appended claims.

What is claimed is:

1. A semiconductor memory device, comprising:

a plurality of memory blocks, each of which includes a matrix of intersecting bit lines and word lines, and a multiplicity of memory cells coupled to respective ones of said bit lines and said word lines adjacent the intersections thereof;

wherein said bit lines are shared in common by said memory blocks;

wherein said bit lines are identified by respective column select signals;

wherein said memory blocks are identified by respective memory block address signals;

a plurality of I/O control circuits operatively associated with respective ones of said memory blocks, each of said I/O control circuits including:

a flash write enable signal generator responsive to a flash write mode indication signal and a respective one of said memory block address signals for generating a memory block specific flash write enable signal;

a pair of first data input/output lines;

a pair of second data input/output lines;

a plurality of first column selectors connected between respective first alternate pairs of said bit lines and said first data input/output lines;

a plurality of second column selectors connected between respective second alternate pairs of said bit lines and said second data input/output lines;

a plurality of flash write control logic circuits each of which is responsive to said memory block specific flash write enable signal and a respective one of said column select signals for generating a corresponding plurality of column selector drive signals;

wherein said first column selectors are responsive to respective ones of said column selector drive signals for selectively coupling data to/from respective ones of said first alternate pairs of said bit lines from/to said first data input/output lines; and, wherein said second column selectors are responsive to respective ones of said column selector drive signals for selectively coupling data to/from respective ones of said second alternate pairs of said bit lines from/to said second data input/output lines.

2. The semiconductor memory device as set forth in claim 1, wherein said first and second column selectors, and said first and second data input/output lines are disposed on a first side of a respective one of said memory blocks.

3. The semiconductor memory device as set forth in claim 2, wherein each of said I/O control circuits further includes:

a pair of third data input/output lines disposed on a second side of a respective one of said memory blocks opposite said first side;

pair of fourth data input/output lines disposed on said second side;

a plurality of third column selectors disposed on said second side, said third column selectors being connected between respective ones of said first alternate pairs of said bit lines and said third data input/output lines;

a plurality of fourth column selectors disposed on said second side, said fourth column selectors being connected between respective ones of said second alternate pairs of said bit lines and said fourth data input/output lines;

wherein said third column selectors are responsive to respective ones of said column selector drive signals for selectively coupling data to/from respective ones of said first alternate pairs of said bit lines from/to said third data input/output lines; and, wherein said fourth column selectors are responsive to respective ones of said column selector drive signals for selectively coupling data to/from respective ones of said second alternate pairs of said bit lines from/to said fourth data input/output lines.

4. The semiconductor memory device as set forth in claim 3, wherein each of said flash write control logic circuits includes a logic OR gate having a first input coupled to a respective one of said memory block specific flash write enable signals, and a second input coupled to a respective one of said column select signals.

5. The semiconductor memory device as set forth in claim 4, wherein each of said flash write enable signal generators include a logic AND gate having a first input coupled to said flash write mode indication signal, and a second input coupled to a respective one of said memory block address signals.

6. The semiconductor memory device as set forth in claim 4, wherein each of said flash write enable signal generators includes:

a logic NAND gate having a first input coupled to said flash write mode indication signal, and a second input coupled to a respective one of said memory block address signals; and, a logic NOR gate having a first input coupled to the output of said NAND gate, and a second input coupled to a write mask signal, wherein the output of said NOR gate constitutes said memory block specific flash write enable signal.

7. The semiconductor memory device as set forth in claim 4, wherein each of said first, second, third, and fourth column selectors comprises a MOS transistor.

8. The semiconductor memory device as set forth in claim 7, wherein each said MOS transistor includes:

a first electrode coupled to a respective one of said bit lines;

a second electrode coupled to a respective one of said data input/output lines; and, a gate electrode coupled to a respective one of said column selector drive signals.

9. A semiconductor memory device, comprising:

a plurality of memory blocks, each of which includes a matrix of intersecting bit lines and word lines, and a multiplicity of memory cells coupled to respective ones of said bit lines and said word lines adjacent the intersections thereof;

wherein said bit lines are shared in common by said memory blocks;

wherein said bit lines are identified by respective column select signals;

wherein said memory blocks are identified by respective memory block address signals;

a plurality of I/O control circuits operatively associated with respective ones of said memory blocks, each of said I/O control circuits including:

a flash write signal generator responsive to a flash write mode indication signal and a respective one of said memory block address signals for generating a memory block specific flash write enable signal;

a pair of first data input/output lines;

a pair of second data input/output lines;

a plurality of first column selectors connected between respective first alternate pairs of said bit lines and said first data input/output lines, said first column selectors being responsive to respective ones of said column select signals for selectively coupling data to/from respective ones of said first alternate pairs of said bit lines from/to said first data input/output lines;

a plurality of second column selectors connected between respective second alternate pairs of said bit lines and said second data input/output lines, said second column selectors being responsive to respective ones of said column select signals for selectively coupling data to/from respective ones of said second alternate pairs of said bit lines from/to said second data input/output lines;

a plurality of third column selectors connected between respective first alternate pairs of said bit lines and said first data input/output lines in parallel with said first column selectors, said third column selectors being responsive to a respective one of said memory block specific flash write enable signals for selectively coupling data to/from respective ones of said first alternate pairs of said bit lines from/to said first data input/output lines; and, a plurality of fourth column selectors connected between respective second alternate pairs of said bit lines and said second data input/output lines in parallel with said second column selectors, said fourth column selectors being responsive to said respective one of said memory block specific flash write enable signals for selectively coupling data to/from respective ones of said second alternate pairs of said bit lines from/to said second data input/output lines.

10. The semiconductor memory device as set forth in claim 9, wherein said first, second, third, and fourth column selectors, and said first and second data input/output lines are disposed adjacent one side of a respective one of said memory blocks.

11. The semiconductor memory device as set forth in claim 9, wherein each of said flash write enable signal generators include a logic AND gate having a first input coupled to said flash write mode indication signal, and a second input coupled to a respective one of said memory block address signals.

12. The semiconductor memory device as set forth in claim 9, wherein each of said flash write enable signal generators includes:

a logic NAND gate having a first input coupled to said flash write mode indication signal, and a second input coupled to a respective one of said memory block address signals; and, a logic NOR gate having a first input coupled to the output of said NAND gate, and a second input coupled to a write mask signal, wherein the output of said NOR gate constitutes said memory block specific flash write enable signal.

13. The semiconductor memory device as set forth in claim 9, wherein each of said first, second, third and fourth column selectors comprises a MOS transistor.

14. The semiconductor memory device as set forth in claim 9, wherein each of said first and second column selectors comprises a MOS transistor which includes:

a first electrode coupled to a respective one of said bit lines;

a second electrode coupled to a respective one of said data input/output lines; and, a gate electrode coupled to a respective one of said column select signals.

15. The semiconductor memory device as set forth in claim 14, wherein each of said third and fourth column selectors comprises a MOS transistor which includes:

a first electrode coupled to a respective one of said bit lines;

a second electrode coupled to a respective one of said data input/output lines; and, a gate electrode coupled to a respective one of said memory block specific flash write enable signals.

16. A semiconductor memory device having a plurality of memory blocks, comprising:

a plurality of flash write enable signal generators operatively associated with respective ones of said memory blocks, each of said flash write enable signal generators including a logic AND gate having a first input coupled to a flash write enable signal and a second input coupled to a respective memory block selection signal, the output of said logic AND gate of each said flash write enable signal generator constituting a respective memory block specific flash write enable signal; and, a plurality of column selector drive signal generators operatively associated with each of said memory blocks, each of said column selector drive signal generators including a logic OR gate having a first input coupled to a respective column select signal and a second input coupled to a respective memory block specific flash write enable signal, the output of each of said column selector drive signal generators constituting a control signal which is coupled to a respective one of a plurality of column selectors each of which is connected between a respective bit line and a respective data input/output line of the semiconductor memory device.

17. The semiconductor memory device as set forth in claim 16, wherein each of said column selectors comprises a MOS transistor having a first electrode coupled to a respective bit line, a second electrode coupled to a respective data input/output line, and a gate electrode coupled to a respective one of said control signals.

18. The semiconductor memory device as set forth in claim 17, wherein each of said flash write enable signal generators further includes:

an inverter coupled to said memory block specific flash write enable signal;

a NOR gate having a first input coupled to the output of said inverter, and a second input coupled to a write mask signal; and, wherein the output of said NOR gate constitutes a conditioned memory block specific write enable signal, said conditioned memory block specific write enable signal being applied as said second input of a respective one of said logic OR gates in place of said memory block specific write enable signal.

19. A flash write circuit for a semiconductor memory device, comprising:

a first column selection gate for selectively coupling a bit line of the memory device to a data input/output line of the memory device in response to a column select signal applied to a control terminal thereof; and, a second column selection gate connected in parallel to said first column selection gate between said bit line and said data input/output line, for selectively coupling said bit line to said data input/output line in response to a flash write enable signal.

20. The flash write circuit as set forth in claim 19, wherein said semiconductor memory device includes a plurality of memory blocks, and said flash write enable signal comprises a memory block specific flash write enable signal.

* * * * *